United States Patent
Tibrewala

(10) Patent No.: US 12,340,154 B2
(45) Date of Patent: Jun. 24, 2025

(54) LATENCY BALANCING OF PATHS IN MULTI-PROCESSOR COMPUTING ARCHITECTURE DESIGNS FOR DEADLOCK AVOIDANCE

(71) Applicant: Xilinx, Inc., San Jose, CA (US)

(72) Inventor: Krishnam Tibrewala, Bengaluru (IN)

(73) Assignee: Xilinx, Inc., San Jose, CA (US)

( * ) Notice: Subject to any disclaimer, the term of this patent is extended or adjusted under 35 U.S.C. 154(b) by 465 days.

(21) Appl. No.: 17/818,341

(22) Filed: Aug. 8, 2022

(65) Prior Publication Data

US 2024/0046015 A1    Feb. 8, 2024

(51) Int. Cl.
| | |
|---|---|
| *G06F 30/3308* | (2020.01) |
| *G06F 30/327* | (2020.01) |
| *G06F 30/3323* | (2020.01) |
| *G06F 30/367* | (2020.01) |
| *G06F 30/373* | (2020.01) |
| *G06F 30/392* | (2020.01) |
| *G06F 30/398* | (2020.01) |

(52) U.S. Cl.
CPC ...... *G06F 30/3308* (2020.01); *G06F 30/3323* (2020.01); *G06F 30/327* (2020.01); *G06F 30/367* (2020.01); *G06F 30/373* (2020.01); *G06F 30/392* (2020.01); *G06F 30/398* (2020.01)

(58) Field of Classification Search
CPC ............. G06F 30/3308; G06F 30/3323; G06F 30/327; G06F 30/367; G06F 30/373; G06F 30/392; G06F 30/398
USPC ................ 716/106, 104, 111, 122, 132, 136; 703/14
See application file for complete search history.

(56) References Cited

U.S. PATENT DOCUMENTS

| | | | |
|---|---|---|---|
| 5,648,913 A | 7/1997 | Bennett et al. | |
| 5,659,484 A | 8/1997 | Bennett et al. | |
| 5,971,595 A | 10/1999 | Grant et al. | |
| 6,053,948 A * | 4/2000 | Vaidyanathan | G06F 30/33 703/20 |
| 6,086,629 A | 7/2000 | McGettigan et al. | |
| 6,308,309 B1 | 10/2001 | Gan et al. | |
| 7,073,149 B2 | 7/2006 | Knol et al. | |
| 7,185,309 B1 | 2/2007 | Kulkarni et al. | |
| 7,251,804 B1 | 7/2007 | Trimberger | |
| 7,281,093 B1 | 10/2007 | Kulkarni et al. | |

(Continued)

OTHER PUBLICATIONS

Cho et al., "Diastolic Arrays: Throughput-Driven Reconfigurable Computing", IEEE, 2008, pp. 457-464. (Year: 2008).*
Murthy et al., "Multidimensional Synchronous Dataflow", IEEE Transactions on Signal Processing, vol. 50, No. 7, Jul. 2002, pp. 2064-2079. (Year: 2002).*
Cho, M. et al., "BoxRouter: A New Global Router Based on Box Expansion and Progressive ILP," In ACM Proc. of DAC 2006, Jul. 24-28, 2006, pp. 373-378.

(Continued)

*Primary Examiner* — Phallaka Kik
(74) *Attorney, Agent, or Firm* — Kevin T. Cuenot

(57) ABSTRACT

Providing first-in-first-out (FIFO) memory guidance for a multi-processor computing architecture includes compiling a design for a data processing array to generate a compiled design. The compiled design is mapped and routed to the data processing array. The compiled design is simulated using a modified device model of the data processing array. The modified device model uses infinite FIFO models. FIFO memory usage data is generated by tracking amounts of data stored in the infinite FIFO memory models during runtime of the simulation of the compiled design. FIFO memory requirements for one or more nets of the design are determined from the FIFO memory usage data and the compiled design.

20 Claims, 10 Drawing Sheets

(56) References Cited

U.S. PATENT DOCUMENTS

| | | |
|---|---|---|
| 7,367,007 B1 | 4/2008 | Sundararajan et al. |
| 7,500,060 B1 | 3/2009 | Anderson et al. |
| 7,574,680 B1 | 8/2009 | Kulkarni et al. |
| 7,650,248 B1 | 1/2010 | Baxter |
| 7,970,977 B1 | 6/2011 | Li |
| 8,006,021 B1 | 8/2011 | Li et al. |
| 8,020,163 B2 | 9/2011 | Nollet et al. |
| 8,104,011 B1 | 1/2012 | Sundararajan et al. |
| 8,154,989 B1 | 4/2012 | Susai |
| 10,445,456 B1 | 10/2019 | Fraisse |
| 10,565,346 B1 | 2/2020 | Suthar et al. |
| 10,628,547 B1 | 4/2020 | Swarbrick et al. |
| 2003/0046054 A1* | 3/2003 | Wheeler .............. G06F 30/33 703/15 |
| 2003/0167348 A1 | 9/2003 | Greenblat |
| 2003/0172189 A1 | 9/2003 | Greenblat |
| 2005/0080610 A1* | 4/2005 | Toma .............. G06F 30/33 703/22 |
| 2005/0102572 A1* | 5/2005 | Oberlaender .......... G06F 30/33 714/29 |
| 2009/0144045 A1* | 6/2009 | Kanade .............. G06F 30/30 703/21 |
| 2015/0154337 A1 | 6/2015 | Fang |
| 2022/0092247 A1* | 3/2022 | Koeplinger .......... G06F 8/443 |

OTHER PUBLICATIONS

Wood, R. et al., "FPGA Routing and Routability Estimation via Boolean Satisfiability," IEEE Transactions on Very Large Scale Integration (VLSI) Systems, vol. 6, No. 2, Jun. 1998, 10 pg.

Nam, G. et al., "A New FPGA Detailed Routing Approach Via Search-Based Boolean Satisfiability," IEEE Transactions on Computer-Aided Design of Intergrated Circuits and Systems, vol. 21, No. 6, Jun. 2002, 11 pg.

McMurchie, L. et al., "PathFinder: A Negotiation-Based Performance-Driven Router for FPGAs," In Proc. ACM/IEEE Int'l. Sym. Field Programmable Gate Arrays, Feb. 1995, 7 pg.

Nam, G. et al., "A Comparative Study of Two Boolean Formulations of FPGA Detailed Routing Constraints," IEEE Trans. on Computers, vol. 53, No. 6, Jun. 2004, 9 pg.

Fraisse, H. et al., "Boolean Satisfiability-Based Routing and its Applicaiton to Xilinx UltraScale Clock Network," In Proc. of 2016 ACM/SIGDA Int'l. Sym. on Fieldl-Programmable Gate Arrays, Feb. 2016, 6 pg.

Hu, J. et al., "Sidewinder: A Scalable ILP-Based Router," In Proc. of 2008 Int'l. Workshop on System Level Interconnect Prediction, Apr. 5-8, 2008, 7 pg.

Dally, W.J. et al., "Deadlock-Free Message Routing in Multiprocessor Interconnection Networks," In IEEE Trans. on Computers, vol. 36, No. 5, May 1987, pp. 547-553.

* cited by examiner

LATENCY BALANCING OF PATHS IN MULTI-PROCESSOR COMPUTING ARCHITECTURE DESIGNS FOR DEADLOCK AVOIDANCE

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to multi-processor computing architectures and, more particularly, to avoiding deadlocks in designs for multi-processor computing architectures through latency balancing of data paths.

BACKGROUND

Multi-processor computing architectures offer increased computational capabilities and increased data throughput compared to their single processor counterparts. In some multi-processor systems, the processors communicate with one another and/or with other external systems by way of data streams. Designs developed for implementation in multi-processor computing architectures that use data streams can be vulnerable to deadlocks. A deadlock refers to an unintentional and permanent cessation of data processing by the design as implemented in the multi-processor computing architecture. A deadlock is considered "permanent" in that a reset or reboot of the design is required to continue processing data. By comparison, a stall refers to a temporary cessation of processing that may reduce data throughput of the design. A stall does not require a reset or reboot of the design.

Deadlocks may arise from a number of different conditions. As an example, in the case where two or more data streams converge or reconverge, an imbalance in pipeline depths of convergent data streams may cause a deadlock. The data stream with the smaller pipeline depth, for example, may fill and exert back pressure on an upstream data producing processor. In response to the back pressure, the data producing processor stalls and is unable to push any additional data onto the now filled data path. At the same time, the consumer processor may stall waiting for data on the data path with the larger pipeline depth. In another example, mismatches in producer-consumer write-read rates can lead to excessive data stream stalls and/or deadlocks.

SUMMARY

In one or more example implementations, a method includes compiling a design for a data processing array to generate a compiled design. The compiled design is mapped and routed to the data processing array. The method includes simulating the compiled design using a modified device model of the data processing array. The modified device model uses infinite first-in-first-out memory (FIFO) models. The method includes generating FIFO memory usage data by tracking amounts of data stored in the infinite FIFO memory models during runtime of the simulation of the compiled design. The method includes determining FIFO memory requirements for one or more nets of the design based on the FIFO memory usage data and the compiled design.

In one aspect, tracking amounts of data includes determining a largest amount of data stored within the infinite FIFO memory models during runtime of the simulation.

In another aspect, the FIFO memory requirements indicate that an additional FIFO memory is needed for the one or more nets of the design.

In another aspect, the FIFO memory requirements specify an amount of the additional FIFO memory needed for the one or more nets of the design.

In another aspect, the method includes generating, based on the FIFO memory usage data and the compiled design, a design constraint for the design. The design constraint specifies insertion of a FIFO memory on the one or more nets of the design.

In another aspect, the method includes compiling the design using the design constraint resulting in a further compiled design including the FIFO memory specified by the design constraint.

In another aspect, the method includes performing a further simulation of the further compiled design using an unmodified device model that has unmodified stream switch models with finite FIFO memory models.

In another aspect, a prior simulation of the compiled design using the unmodified device model has failed. In that case, the method can include, in response to determining that the further simulation passed, determining that a cause of failure of the prior simulation of the compiled design using the unmodified device model failed due to a deadlock.

In another aspect, a prior simulation of the compiled design using the unmodified device model has passed. In that case, the method can include, in response to determining that the further simulation passes, comparing a performance metric from the further simulation with a performance metric from the prior simulation of the compiled design using the unmodified device model. The method also includes determining whether the FIFO memory included in the further compiled design improved performance relative to the compiled design based on the comparing.

In one or more example implementations, a system includes one or more processors configured to initiate operations. The operations include compiling a design for a data processing array to generate a compiled design. The compiled design is mapped and routed to the data processing array. The operations include simulating the compiled design using a modified device model of the data processing array. The modified device model uses infinite FIFO models. The operations include generating FIFO memory usage data by tracking amounts of data stored in the infinite FIFO memory models during runtime of the simulation of the compiled design. The operations include determining FIFO memory requirements for one or more nets of the design based on the FIFO memory usage data and the compiled design.

In one aspect, tracking amounts of data includes determining a largest amount of data stored within the infinite FIFO memory models during runtime of the simulation.

In another aspect, the FIFO memory requirements indicate that an additional FIFO memory is needed for the one or more nets of the design.

In another aspect, the FIFO memory requirements specify an amount of the additional FIFO memory needed for the one or more nets of the design.

In another aspect, the operations include generating, based on the FIFO memory usage data and the compiled design, a design constraint for the design. The design constraint specifies insertion of a FIFO memory on the one or more nets of the design.

In another aspect, the operations include compiling the design using the design constraint resulting in a further compiled design including the FIFO memory specified by the design constraint.

In another aspect, the operations include performing a further simulation of the further compiled design using an unmodified device model that has unmodified stream switch models with finite FIFO memory models.

In another aspect, a prior simulation of the compiled design using the unmodified device model has failed. In that case, the operations include, in response to determining that the further simulation passed, determining that a cause of failure of the prior simulation of the compiled design using the unmodified device model failed due to a deadlock.

In another aspect, a prior simulation of the compiled design using the unmodified device model has passed. In that case, the operations include, in response to determining that the further simulation passes, comparing a performance metric from the further simulation with a performance metric from the prior simulation of the compiled design using the unmodified device model. The operations also include determining whether the FIFO memory included in the further compiled design improved performance relative to the compiled design based on the comparing.

In one or more example implementations, a computer program product includes one or more computer-readable storage media, and program instructions collectively stored on the one or more computer-readable storage media. The program instructions are executable by computer hardware to initiate operations. The operations include compiling a design for a data processing array to generate a compiled design. The compiled design is mapped and routed to the data processing array. The operations include simulating the compiled design using a modified device model of the data processing array. The modified device model uses infinite FIFO models. The operations include generating FIFO memory usage data by tracking amounts of data stored in the infinite FIFO memory models during runtime of the simulation of the compiled design. The operations include determining FIFO memory requirements for one or more nets of the design based on the FIFO memory usage data and the compiled design.

In one aspect, tracking amounts of data includes determining a largest amount of data stored within the infinite FIFO memory models during runtime of the simulation.

In another aspect, the FIFO memory requirements indicate that an additional FIFO memory is needed for the one or more nets of the design.

In another aspect, the FIFO memory requirements specify an amount of the additional FIFO memory needed for the one or more nets of the design.

In another aspect, the operations include generating, based on the FIFO memory usage data and the compiled design, a design constraint for the design. The design constraint specifies insertion of a FIFO memory on the one or more nets of the design.

In another aspect, the operations include compiling the design using the design constraint resulting in a further compiled design including the FIFO memory specified by the design constraint.

In another aspect, the operations include performing a further simulation of the further compiled design using an unmodified device model that has unmodified stream switch models with finite FIFO memory models.

In another aspect, a prior simulation of the compiled design using the unmodified device model has failed. In that case, the operations include, in response to determining that the further simulation passed, determining that a cause of failure of the prior simulation of the compiled design using the unmodified device model failed due to a deadlock.

In another aspect, a prior simulation of the compiled design using the unmodified device model has passed. In that case, the operations include, in response to determining that the further simulation passes, comparing a performance metric from the further simulation with a performance metric from the prior simulation of the compiled design using the unmodified device model. The operations also include determining whether the FIFO memory included in the further compiled design improved performance relative to the compiled design based on the comparing.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

This disclosure relates to multi-processor computing architectures and, more particularly, to avoiding deadlocks in designs for multi-processor computing architectures through latency balancing of data paths. The disclosure also relates to determining whether throughput of the design can be improved.

In one or more example implementations, the inventive arrangements provide methods, systems, and computer-program products that are capable of detecting whether a design for a multi-processor computing architecture is likely to experience a deadlock during runtime. Further, the inventive arrangements are capable of determining whether the inclusion of FIFO memory in nets (e.g., data paths) of the design alleviates the deadlock. In cases where inclusion of FIFO memory does alleviate a deadlock, the inventive arrangements are capable of indicating particular net(s) to which FIFO memories should be added. Further, the inventive arrangements are capable of indicating a size of the FIFO memory to be added for each respective net.

In one or more other example implementations, the inventive arrangements may be used to improve the throughput of a design for a multi-processor computing architecture. For example, in some cases, the design may experience stalls in which one or more processors are temporarily halted. In such cases, the inventive arrangements may be applied to improve data throughput by alleviating the stalls through insertion of FIFO memory on selected net(s). Further aspects of the inventive arrangements are described below with reference to the figures.

Figure 1:
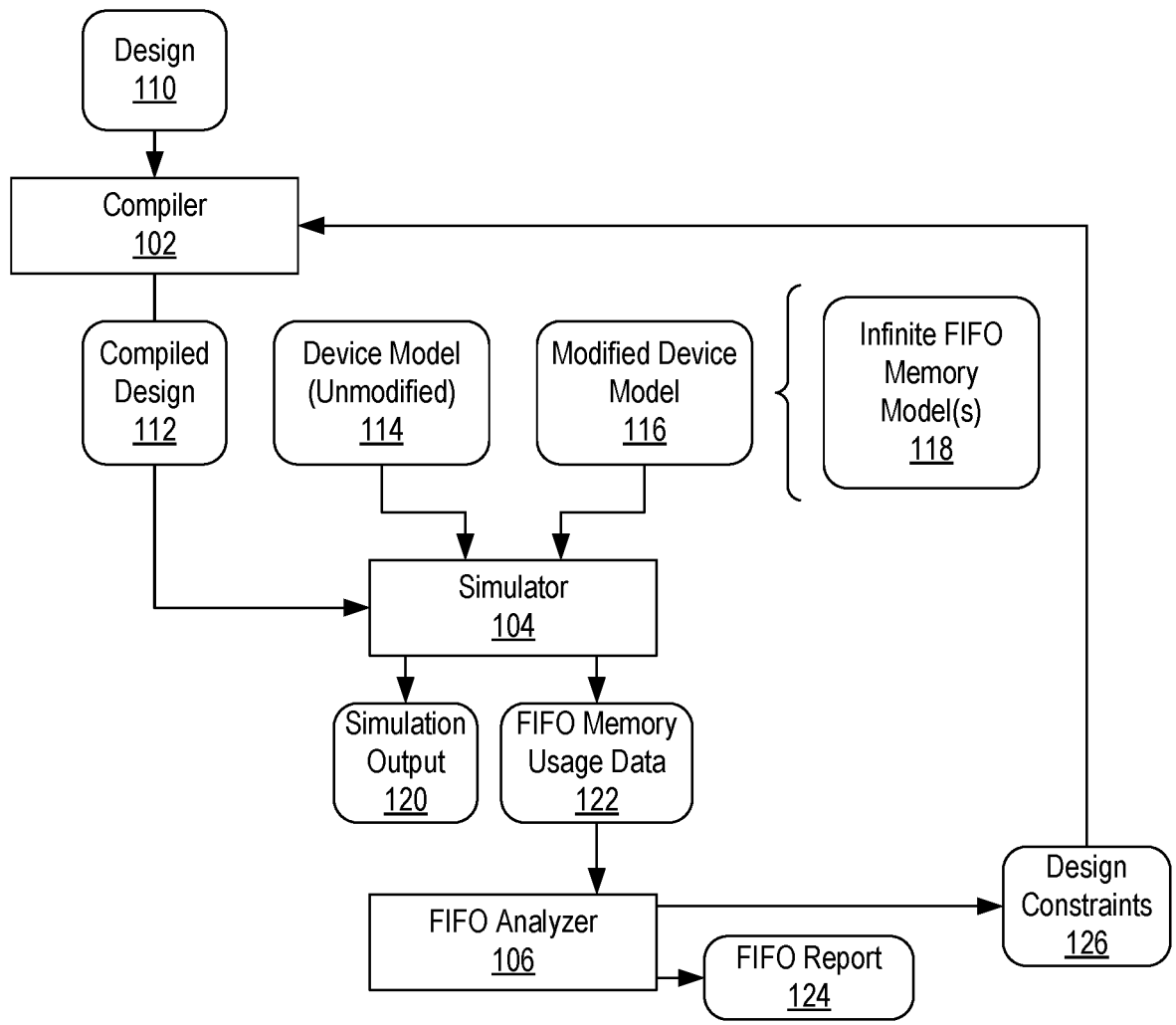
FIG. 1 illustrates certain operative features of an example Electronic Design Automation (EDA) system.

FIG. 1 illustrates certain operative features of an example Electronic Design Automation (EDA) system 100. EDA system 100 may be implemented as a data processing system, e.g., a computer, executing suitable operational software or computer-readable program instructions to perform one or more of the operations described within this disclosure. An example of a data processing system that may be used to implement EDA system 100 is described in connection with FIG. 10.

Figure 2:
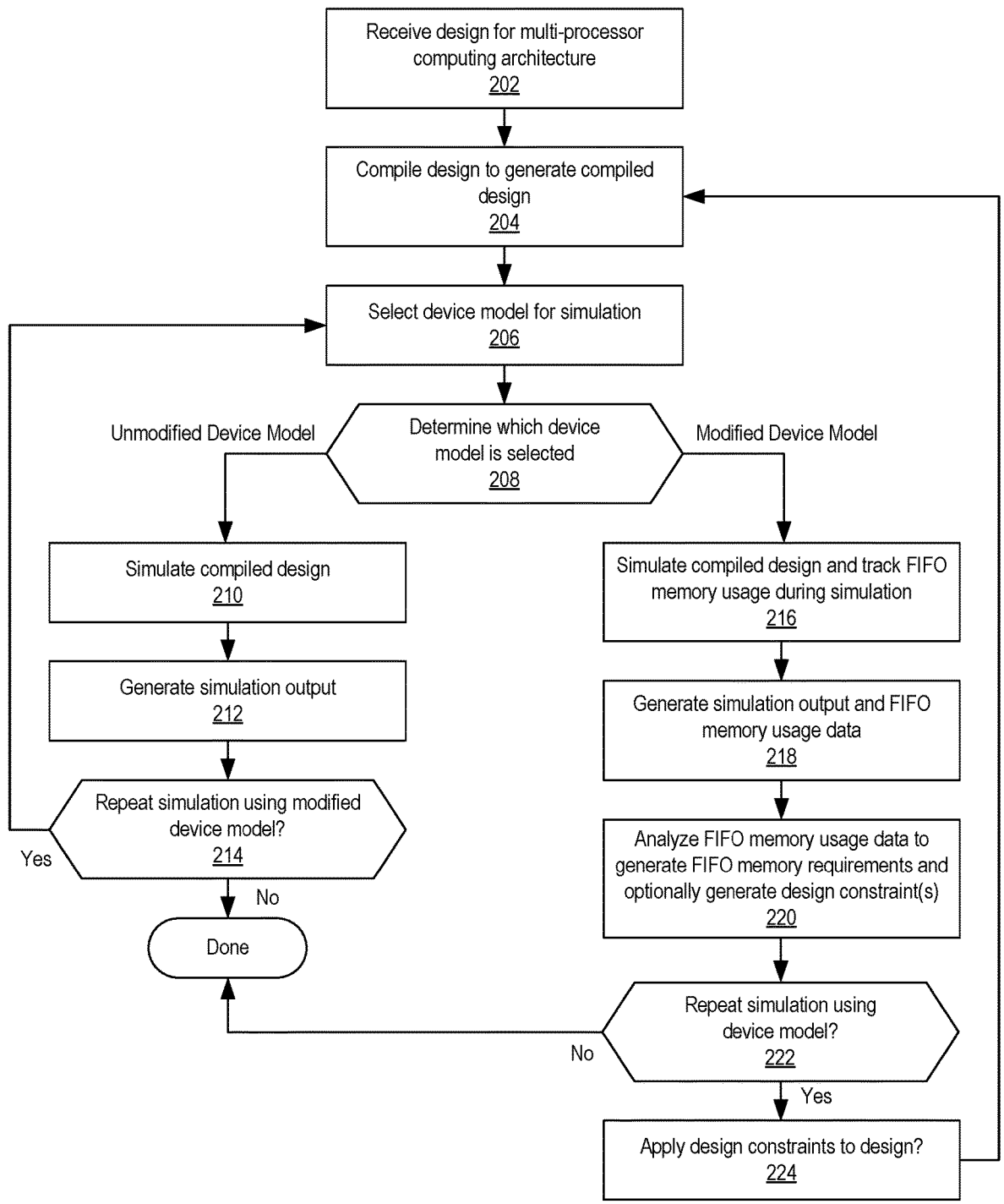
FIG. 2 illustrates an example method of operation performed by the EDA system of FIG. 1.

In the example, EDA system 100 includes a compiler 102, a simulator 104, and a FIFO analyzer 106. Compiler 102, simulator 104, and FIFO analyzer 106 may be implemented as software executed on computer hardware (e.g., a data processing system as described in connection with FIG. 10) or as special-purpose hardware. FIG. 2 illustrates an example method 200 of operation that is performed by EDA system 100 of FIG. 1.

Referring to FIGS. 1 and 2, in block 202, compiler 102 receives a design 110. Design 110 is a design for a multi-processor computing architecture. An example of a multi-processor computing architecture is described in connection with FIG. 3. In one aspect, design 110 is implemented as a data flow graph. The data flow graph may be specified in a high-level computer programming language such as C/C++. Design 110 specifies a plurality of different kernels having a particular connectivity. The kernels may be represented as nodes and the nets connecting the kernels may be represented as edges connecting the nodes of the data flow graph. In this example, the edges represent data streams linking the kernels.

A kernel refers to a data processing element. A kernel may be a user-specified (e.g., custom) data processing element or a data processing element obtained from a standard library of kernels. The kernel may implement any of a variety of different functions including commonly used functions. These functions may be specific to a particular domain such as image processing, communications, cryptography, machine learning, or the like. A kernel may be specified in a programming language such as C/C++ and compiled into computer-readable program instructions that are executable by a hardware processor. Alternatively, a kernel may be compiled into circuitry (e.g., implemented using programmable circuitry such as programmable logic).

In block 204, compiler 102 compiles design 110 to generate a compiled version of the design shown as compiled design 112. Compiler 102 is capable of compiling design 110 into computer-readable program instructions that are executable by hardware processors of the data processing array or of a data processing system as described in FIG. 10 for purposes of simulation. As part of block 204, compiler 102 maps the kernels of design 110 to different compute tiles (e.g., particular cores of compute tiles) of the data processing array. Compiler 102 also routes the data streams (e.g., logical nets) of design 110. The data streams are routed through different data paths of the data processing array. These data paths may include one or more stream switches. Within this disclosure, stream switches are also referred to as "stream interconnects."

Accordingly, compiled design 112 refers to design 110, as compiled, inclusive of the mapping and routing data. Mapping data maps kernels to particular compute tiles of the data processing array. Routing data specifies particular physical data paths through the data processing array for each data stream. A routed data stream of compiled design 112 may be referred to as a net. A net collectively refers to one or more data streams as mapped to a particular physical data path through the data processing array as specified by the routing data. In this regard, the term "net" specifies a particular data path over which the one or more logical nets of the net are routed. In one aspect, a net may include one or more logical nets. That is, unlike the routing of individual signals in programmable logic that are not allowed to overlap, one or more logical nets may be routed through the same physical data path within the data processing array.

In block 206, a particular device model is selected for use during simulation of compiled design 112. Device model 114 may be provided that models the data processing array on which compiled design 112 is to be executed. Device model 114 is an unmodified device model in that the device model includes accurate software models of the underlying hardware components of the data processing array. For example, device model 114 includes models of the various types of tiles and components included in the tiles such as switches, memories, and the like. The FIFO memory models included in device model 114 have a finite amount of memory that is equivalent to the actual amount of memory provided by the physical counterparts (e.g., physical FIFO memories of the data processing array) being modeled. Device model 114 also accurately reflects the architecture or layout of the data processing array.

A modified device model 116 is also provided that models the data processing array on which compiled design 112 is to be executed. In one or more example implementations, device model 116, unlike device model 114, uses certain memory models that are not fixed or finite in size. For example, device model 116 includes one or more infinite FIFO memory models 118. An infinite FIFO memory model 118 is a software model of a FIFO memory. Unlike an actual FIFO memory or the FIFO memory model of device model 114 which are limited to storing a finite amount of data, each infinite FIFO memory model 118 is permitted to expand or grow in size limited only by the resources of EDA system 100 (e.g., data processing system 1000) that are available. As such, each infinite FIFO memory model 118 can accommodate amounts of data larger and, if necessary, significantly larger, than can be accommodated by the actual physical FIFO memory being modeled or a FIFO memory model that is finite. That is, the size of each infinite FIFO memory model 118 included in modified device model 118, as used during simulation, may be unconstrained and permitted to grow as large as needed to store the data conveyed over the nets of compiled design 112 that flow through the respective infinite FIFO memory models 118. It should be appreciated that while infinite FIFO memory model 118 is described as "infinite," constraints on the size of each infinite FIFO memory model 118 may be imposed so that simulation may be performed without error and/or to maintain an acceptable level of runtime performance of the simulation.

One reason for allowing the size of an infinite FIFO memory model to expand in this largely unlimited manner and also grow beyond the size of available actual FIFO memories available in hardware is because the information regarding FIFO size, even if larger than any actual FIFO memories that are available, is helpful to users and/or developers. The user/developer, for example, may be motivated to update kernel code running on the compute tiles to solve the issue.

In block 208, EDA system 100 determines which device model is selected. For purposes of illustration, the user may select device model 114. Accordingly, method 200 proceeds to block 210. In block 210, simulator 104 simulates compiled design 112 based on the selected device model which, in this case, is device model 114.

In block 212, simulator 104 generates simulation output 120. In one aspect, simulation output 120 indicates whether the simulation of compiled design 112 passed or failed. In one aspect, the simulation is considered to have passed when the simulation completes or has generated required and/or expected output. Correspondingly, the simulation is considered to have failed when the simulation does not complete, e.g., errors out, or provides unexpected output. Simulation of compiled design 112 may fail for any of a variety of different reasons. One reason is that a deadlock occurred. Another reason may be a user error such as a kernel being coded incorrectly. Simulation output 120 may also include or specify one or more performance metrics determined during runtime of the simulation. An example of a performance metric specified by simulation output 120 is data throughput of design 110 (or compiled design 112 as the case may be).

In block 214, a determination is made as to whether to repeat the simulation using modified device model 116. In response to determining that the simulation is to be repeated using modified device model 116, method 200 loops back to block 206. For example, if the simulation failed as indicated by the simulation output, the simulation may be repeated using modified device model 116 to determine whether the cause of the failure was a deadlock. If the cause of failure was a deadlock, simulating compiled design 112 using modified device model 116 will result in a passing simulation.

In another example, the throughput of design 110 may be improved through inclusion of additional FIFO memory. Consider a scenario in which the simulation passed. If, during the simulation, compiled design 112 stalled one or more times, it may be the case that improved throughput is achievable through the inclusion of one or more FIFO memories that prevent the stalls. In that case, the simulation may be repeated using modified device model 116. The simulation results obtained using device model 114 may be compared with the simulation results obtained using modified device model 116 to determine whether throughput improved when modified device model 116 is used. An improvement indicates that data throughput of design 110 may be improved through the addition of one or more FIFO memories to nets.

In one or more example implementations, the decision to loop back to block 206 may be performed by EDA system 100 automatically. For example, in response to detecting a failed simulation, EDA system 100 may automatically initiate further simulation using modified device model 116 to determine whether simulation using modified device model 116 passes. In one or more other example implementations, EDA system 100 may automatically initiate further simulation using modified device model 116 in response to a passed simulation and optionally one or more other criteria. For example, EDA system 100 may initiate further simulation using modified device model 116 automatically after performing a passing simulation using device model 114 for purposes of comparing the achieved data throughput using each respective device model to determine whether an improvement in data throughput of design 110 is achieved. In another example, EDA system 100 may initiate further simulation using modified device model 116 in response to a passing simulation and determining that the data throughput achieved during simulation with device model 114 was less than a predetermined threshold amount.

In one or more other example implementations, the decision to perform simulation again and the particular device model used may be specified by the user and received by EDA system 100 as a user input (e.g., command line, file, script, etc.).

Referring back to block 206, modified device model 116 is selected for use during simulation. In this example, modified device model 116 is selected after simulating compiled design 112 using device model 114 and determining that the simulation failed or that the simulation passed, but that improved data throughput may be achievable. In block 208, EDA system 100 determines that modified device model 116 has been selected and method 200 proceeds to block 216.

In block 216, simulator 104 simulates compiled design 112 using modified device model 116. In block 216, simulator 104 simulates compiled design 112 using modified device model 116 of the data processing array. As noted, modified device model 116 uses infinite FIFO memory models 118. Further, in block 216, simulator 104 tracks FIFO memory usage during simulation (e.g., during runtime of the simulation). For example, simulator 104 is capable of generating FIFO memory usage data 122 by tracking amounts of data that are stored in infinite FIFO memory models 118 during runtime of the simulation of the compiled design. In one aspect, the tracking that is performed determines a largest amount of data stored within infinite FIFO memory models 118 during runtime of the simulation.

For example, during runtime of the simulation, the size or amount of data present on nets flowing each infinite FIFO memory model 118 may be tracked. In one aspect, each infinite FIFO memory model 118 is capable of storing a value indicating a largest amount of data that was stored by the infinite FIFO memory model 118 during the simulation. In block 218, simulator 104 generates simulation output 120 and FIFO memory usage data 122. As noted, simulation output 120 may specify whether the simulation passed or failed and may include one or more performance metrics. FIFO memory usage data 122 specifies a maximum amount of data present on each net flowing through an infinite FIFO memory model 118 during the simulation. That is, FIFO memory usage data 122 may include the amount of data stored by each infinite FIFO memory model 118 during the simulation.

It should be appreciated that each infinite FIFO memory model 118 may have a particular location and be used by a particular net of compiled design 112. In one aspect, infinite FIFO memory models 118 are included in stream switch models (e.g., modified versions of thereof) in modified device model 116. In other arrangements infinite FIFO memory models 118 may be included in modified device model 116 as independent models (e.g., not contained in stream switch models). For example, infinite FIFO memory models 118 may be incorporated in modified device model 116 at various locations along different data paths.

In block 220, FIFO analyzer 106 analyzes FIFO usage data and determines FIFO memory requirements for one or more nets of compiled design 112 based on FIFO memory usage data 122. In one aspect, the FIFO memory requirements indicate that an additional FIFO memory is needed for the one or more nets of the design. The FIFO memory requirements also may specify an amount of the additional FIFO memory needed for the one or more nets of the design.

In one aspect, the FIFO usage data is contained in a FIFO report 124 generated by FIFO analyzer 106. FIFO report 124 may be output as a file that specifies which nets of design 110 may benefit from added FIFO memory and how much FIFO memory should be added (e.g., how large the FIFO memory for each net should be). For example, FIFO analyzer 106 is capable of generating FIFO report 124 by analyzing compiled design 112 (e.g., the data flow graph including connectivity, mapping, and routing information) and FIFO memory usage data 122 to construct a weighted graph where weights specify FIFO guidance. The weights, for example, may be annotated on edges of the graph representing nets. The degree of the weight may indicate the size of the FIFO memory needed on the net. FIFO analyzer 106 may apply one or more heuristics on the constructed weighted graph to generate FIFO report 124. Examples of the heuristics used and how FIFO analyzer 106 applies the heuristics are described in connection with FIG. 9. FIFO report 124, for example, may specify a list of nets of design 110 and the size of FIFO memory that is required for that net as determined from the FIFO memory usage data 122 from the simulation. The size of FIFO memory recommended may account for any FIFO memory already present in the nets whether by virtue of the existing design 110 and/or by virtue of the FIFO memory available in the actual stream switches or other components of the data paths taken by the nets of compiled design 112.

In block 220, FIFO analyzer 106 may optionally generate a set of one or more design constraints 126. In one aspect, FIFO analyzer 106 is capable of transforming FIFO report 124 into design constraints 126. In another aspect, FIFO analyzer 106 is capable of generating design constraints 126 from the FIFO memory usage data 122 and compiled design 112. Design constraints 126 may be output as a file that is usable or consumable by compiler 102 to compile design 110. Design constraints 126 specify insertion of one or more FIFO memories on one or more nets of design 110.

In another aspect, as part of block 220, EDA system 100 is capable of automatically evaluating simulation output 120. In one aspect, where the prior simulation of the design using device model 114 was performed and failed, in response to determining that the most recent simulation using device model 116 passed, EDA system 100 determines that the cause of failure of the prior simulation of compiled design 112 using device model 114 was deadlock. EDA system 100 is capable of outputting a notification that the cause of failure of the prior simulation using device model 114 was a deadlock.

In another aspect, as part of block 220, where the prior simulation of the design using device model 114 passed, in response to determining that the most recent simulation of the design using device model 116 passed, EDA system 100 is capable of comparing a performance metric from the prior simulation with a performance metric from most recent simulation of compiled design 112. EDA system 100 determines whether including additional FIFO memory improves performance of the design. EDA system 100 is capable of outputting a notification that performance of the design can be improved through inclusion of additional FIFO memory.

In block 222, a determination is made as to whether to repeat the simulation using the device model 114 with design constraints 126 applied to design 110. In response to determining that the simulation is to be repeated using device model 114 and design constraints 126, method 200 continues to block 224. In response to determining that the simulation is not to be repeated using device model 114 and design constraints 126, method 200 may end.

For example, to determine whether design constraints 126 remove a deadlock (e.g., cause the simulation to pass) or improve data throughput, the simulation may be rerun using a version of design 110 that is compiled by compiler 102 using design constraints 126. Further, the simulation would be run using device model 114. Accordingly, in block 224, design constraints 126 are applied to design 110. For example, design constraints 126 may be provided, in association with design 110, to compiler 102.

In block 204, compiler 102 compiles design 110 using design constraint(s) 126. In compiling design 110 using design constraints 126, a new version of compiled design 112 is generated that includes one or more additional FIFO memories in accordance with FIFO report 124 and/or design constraints 126. That is, the FIFO memories added into compiled design 112 are those suggested or specified for insertion by design constraints 126.

In performing block 206 again, device model 114 is selected. In block 208, method 200 continues to block 210 to perform simulation. In block 210, simulator 104 performs a further simulation of newly compiled design 112 using device model 114 that includes unmodified FIFO memory models (e.g., finite FIFO memory models). In block 212, simulation output 120 is generated.

In one or more example implementations, EDA system 100 is capable of automatically evaluating simulation output 120. For example, where a prior simulation of compiled design 112 (e.g., without any additional FIFO memories having been added per design constraints 126) using device model 114 is performed and fails, EDA system 100 is capable of determining whether the current or most recent simulation (e.g., the version of compiled design 112 with the additional FIFO memories having been added per design constraints 126) passed. In response to determining that the most recent simulation of compiled design 112 with the additional FIFO memory passed, EDA system 100 is capable of outputting a notification that the cause of failure of the prior simulation using device model 114 was a deadlock. EDA system 100 may also indicate that design constraints 126 remove the deadlock through inclusion of one or more additional FIFO memories. If the most recent simulation (e.g., of compiled design 112 including FIFO memories as specified by design constraints 126) fails, EDA system 100 is capable of outputting a notification to that effect. In that case, the cause of the failure may be determined to be something other than deadlock.

In another aspect, wherein a prior simulation of the design (e.g., without any additional FIFO memory as specified by design constraints 126) using device model 114 passed, in response to determining that the further simulation (e.g., most recent simulation where design 112 includes the additional FIFO memory specified by design constraints 126) and using device model 114 passes, EDA system 100 is capable of comparing a performance metric from the further simulation with a performance metric from the prior simulation of compiled design 112. EDA system 100 determines whether the FIFO memory included in the further (e.g., most recent) compiled design improved performance relative to the compiled design prior to the addition of the FIFO memory based on the comparing.

For example, where a prior simulation of compiled design 112 (e.g., without any added FIFO memories as specified by constraints 126) using device model 114 passed, EDA system 100 is capable of determining whether the current or most recent simulation of compiled design 112 (e.g., with the added FIFO memories specified by design constraints 126) achieved a data throughput that exceeds the data throughput of the prior simulation. In that case, EDA system 100 is capable of generating a notification that inclusion of the FIFO memories per design constraints 126 improved data throughput. If no improvement in data throughput is achieved by including FIFO memories in accordance with design constraints 126, EDA system 100 is capable of outputting a notification to that effect.

Figure 3:
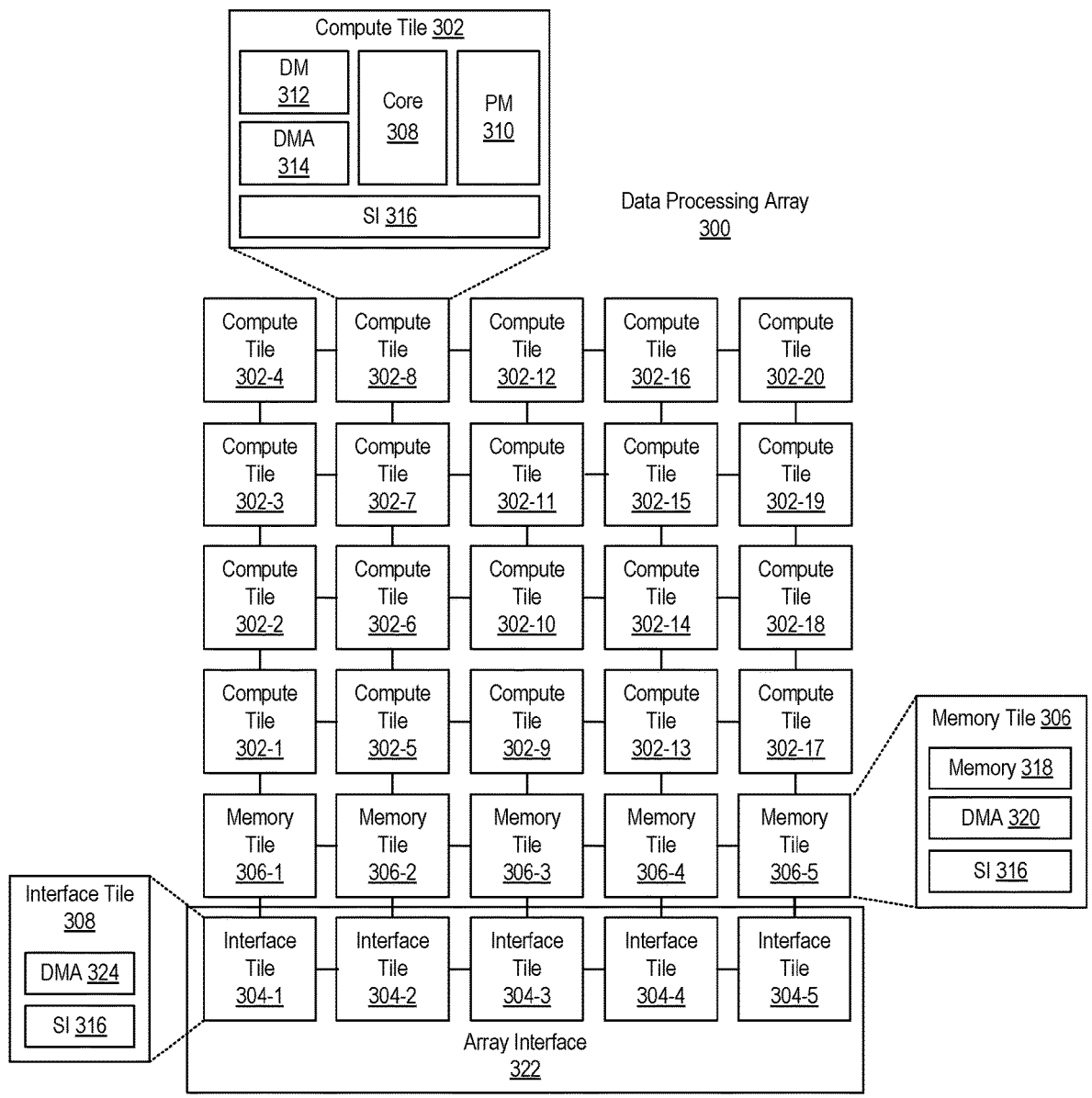
FIG. 3 illustrates an example implementation of a data processing array.

FIG. 3 illustrates an example implementation of a data processing array 300. Data processing array 300 is an example of a multi-processor computing architecture. Data processing array 300 may be implemented as a plurality of interconnected tiles. The term "tile," as used herein in connection with a data processing array, means a circuit block. The interconnected tiles of data processing array 300 include compute tiles 302 and interface tiles 304. Data processing array 300 optionally includes one or more memory tiles 306. The tiles illustrated in FIG. 3 may be arranged in an array or grid and are hardwired.

Each compute tile 302 can include one or more cores 308, a program memory (PM) 310, a data memory (DM) 312, a DMA circuit 314, and a stream interconnect (SI) 316. Within this disclosure, the term "stream interconnect" may be used interchangeably with the term "stream switch." In one aspect, each core 308 is capable of executing program code stored in program memory 310. In one aspect, each core 308 may be implemented as a scalar processor, as a vector processor, or as a scalar processor and a vector processor operating in coordination with one another.

In one or more examples, each core 308 is capable of directly accessing the data memory 312 within the same compute tile 302 and the data memory 312 of any other compute tile 302 that is adjacent to the core 308 of the compute tile 302 in the up, down, left, and/or right directions. Core 308 sees data memories 312 within the same tile and in one or more other adjacent compute tiles as a unified region of memory (e.g., as a part of the local memory of the core 308). This facilitates data sharing among different compute tiles 302 in data processing array 300. In other examples, core 308 may be directly connected to data memories 312 in other compute tiles 302.

Cores 308 may be directly connected with adjacent cores 308 via core-to-core cascade connections (not shown). In one aspect, core-to-core cascade connections are unidirectional and direct connections between cores 308. In another aspect, core-to-core cascade connections are bidirectional and direct connections between cores 308. In general, core-to-core cascade connections generally allow the results stored in an accumulation register of a source core 308 to be provided directly to an input of a target or load core 308 without traversing the stream interconnect 316 (e.g., without using DMA 314) and/or being written by a first core 308 to data memory 312 to be read by a different core 308.

In an example implementation, compute tiles 302 do not include cache memories. By omitting cache memories, data processing array 300 is capable of achieving predictable, e.g., deterministic, performance. Further, significant processing overhead is avoided since maintaining coherency among cache memories located in different compute tiles 302 is not required. In a further example, cores 308 do not have input interrupts. Thus, cores 308 are capable of operating uninterrupted. Omitting input interrupts to cores 308 also allows data processing array 300 to achieve predictable, e.g., deterministic, performance.

Data processing array 300 may include one or more memory tiles 306. Memory tiles 306 include a memory 318 (e.g., a RAM), a DMA circuit 320, and a stream interconnect 316. Each memory tile 306 may read and/or write to the memory 318 of an adjacent memory tile 306 by way of the DMA included in the memory tile 306. Further, each compute tile 302 in data processing array 300 is capable of reading and writing to any one or more of memory tiles 306. Memory tiles 306 are characterized by the lack of computational components such as processors (e.g., cores 308).

Interface tiles 304 form an array interface 322 for data processing array 300. Array interface 322 operates as an interface that connects tiles of data processing array 300 to other resources of the particular IC in which data processing array 300 is disposed. In the example of FIG. 3, array interface 322 includes a plurality of interface tiles 304 organized in a row. Interface tiles 304 can include a stream interconnect 316 and a DMA circuit 324. Interface tiles 304 are connected so that data may be propagated from one interface tile to another bi-directionally. Each interface tile 304 is capable of operating as an interface for the column of tiles directly above and is capable of interfacing such tiles with components and/or subsystems of an IC including data processing array 300.

Figure 4:
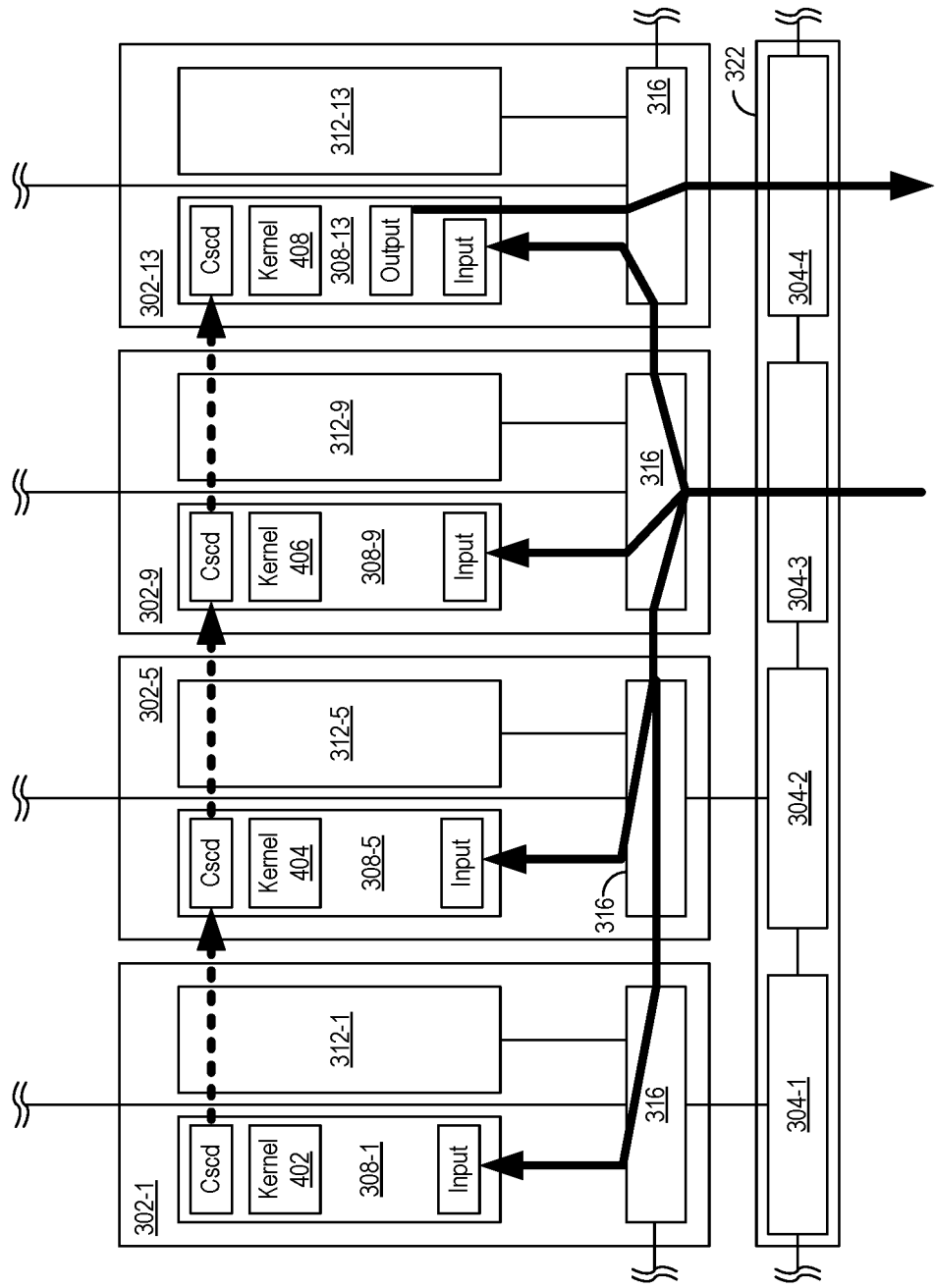
FIG. 4 illustrates an example of a design implemented on a portion of a data processing array.

FIG. 4 illustrates an example of a design implemented on a portion of data processing array 300. For purposes of illustration, memory tiles 306 are omitted such that the bottom row of compute tiles 302 couple, e.g., directly, to interface tiles 304. In the example, kernels 402, 404, 406, and 408 have been mapped to particular cores 308 of compute tiles 302. Kernels 402-408 may be specified as part of compiled design 112. The nets of compiled design 112, as routed, are shown in bold. Data is received via the stream interconnects 316 in interface tile 304-3 and provided to the stream interconnect 316 of compute tile 302-9. The data is routed from stream interconnect 316 of compute tile 302-9 to stream interconnect 316 of each of compute tiles 302-1, 302-5 and 302-13. In the example, cores 308-1, 308-5, 308-9, and 308-13 also communicate by way of cascade (Cscd) connections illustrated with dashed and bolded lines. Data is output from core 308-13 through stream interconnect 316 of compute tile 302-13 through the stream interconnect 316 of interface tile 304-4.

In the example of FIG. 4, the inventive arrangements are capable of evaluating nets that couple different ones of stream interconnects 316 of compute tiles 302 as to whether insertion of FIFO memories will improve data throughput and/or remove deadlock(s). In the example of FIGS. 3 and 4, each stream interconnect 316 may include a predetermined or finite amount of FIFO memory. This FIFO memory may be allocated by compiler 102 to selected nets flowing through the stream interconnect 316 based on design constraints 126 to add FIFO memor(ies) to nets within compiled design 112.

FIFO memories also may be inserted into a net by allocating a portion of data memory 312 to particular nets. For example, compiler 102 may allocate a portion of data memory 312-1 to a net connected to stream interconnect 316 of compute tile 302-1 to implement a FIFO memory in accordance with design constraints 126. Compiler 102 may allocate a portion of data memory 312-5 to a net connected to stream interconnect 316 of compute tile 302-5 to implement a FIFO memory in accordance with design constraints 126. Compiler 102 may allocate a portion of data memory 312-9 to a net connected to stream interconnect 316 of compute tile 302-9 to implement a FIFO memory in accordance with design constraints 126. Compiler 102 may allocate a portion of data memory 312-13 to a net connected to stream interconnect 316 of compute tile 302-13 to implement a FIFO memory in accordance with design constraints 126.

Referring to FIGS. 3 and 4, device model 114 and modified device model 116 may include a programmatic (e.g., software) model of each of the various components of data processing array 300. Device models 114 and 116 may also specify the particular circuit architecture (e.g., grid arrangement) of data processing array 300.

Figure 5:
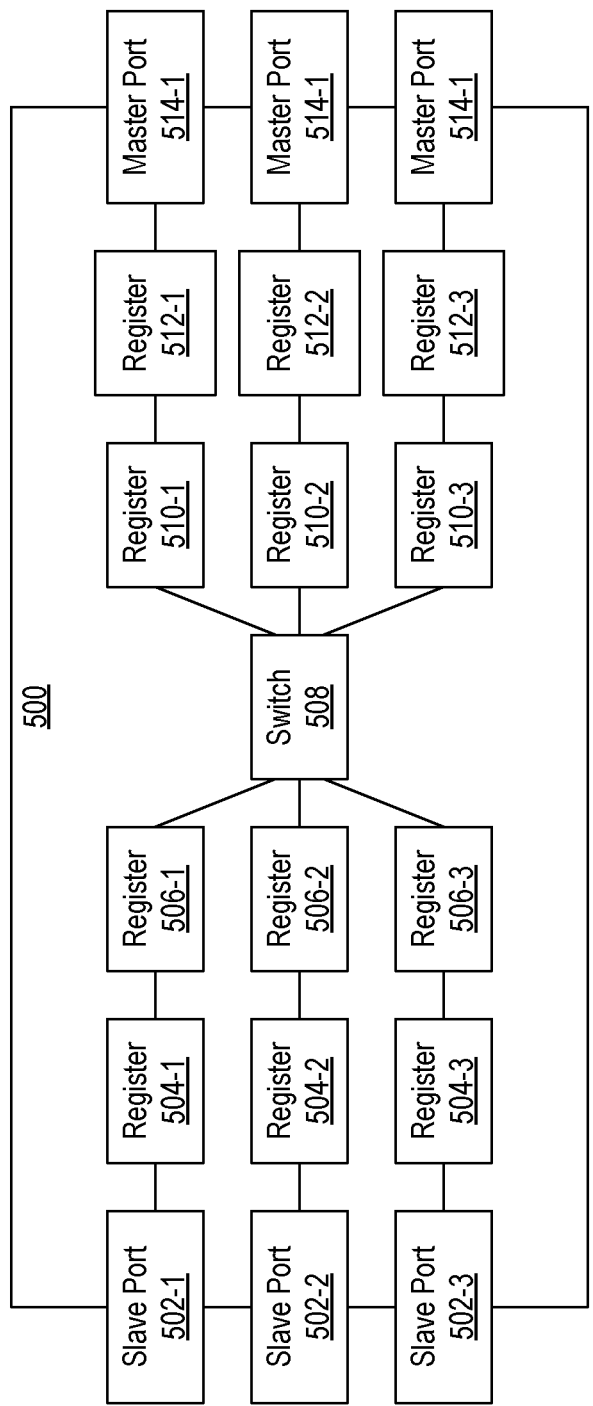
FIG. 5 illustrates an example of an unmodified stream switch model.

FIG. 5 illustrates an example of a stream switch model 500. Stream switch model 500 may be used as part of device model 114 to represent stream interconnects 316 and is an example of an unmodified stream switch model. That is, stream switch model 500 includes a finite amount of FIFO memory that is the same as the available FIFO memory of stream interconnect 316. In the example of FIG. 5, stream switch model 500 includes slave ports 502-1, 502-2, and 502-3. Slave ports 502 represent input ports of stream interconnect 316. In the example, stream switch model 500 is capable of handling nets of multiple data paths. A number of nets may be received on each of slave ports 502-1, 502-2, and 502-3. Stream switch model 500 includes registers 504-1, 504-2, and 504-3, registers 506-1, 506-2, and 506-3, registers 510-1, 510-2, and 510-3, registers 512-1, 512-2, and 512-3, and a switch 508. Further, stream switch model 500 includes master ports 514-1, 514-2, and 514-3. Master ports 514 represent output ports of stream interconnect 316.

Each of registers 504, 506, 510, and 512 may provide a particular amount of storage or have a particular depth. For purposes of illustration, each of registers 504, 506, 510, and 512 may provide a depth of 2 data entries (e.g., provide storage for 2 samples of a particular bit-width). It should be appreciated that the particular amount of registering available and the number of nets that can be handled are provided for purposes of illustration and not limitation. The implementation of stream switch model 500 will correspond to the actual circuit architecture of the stream interconnect 316 being modeled in the device model. It should be appreciated that different stream interconnects 316 may be implemented differently and have corresponding models.

Figure 6:
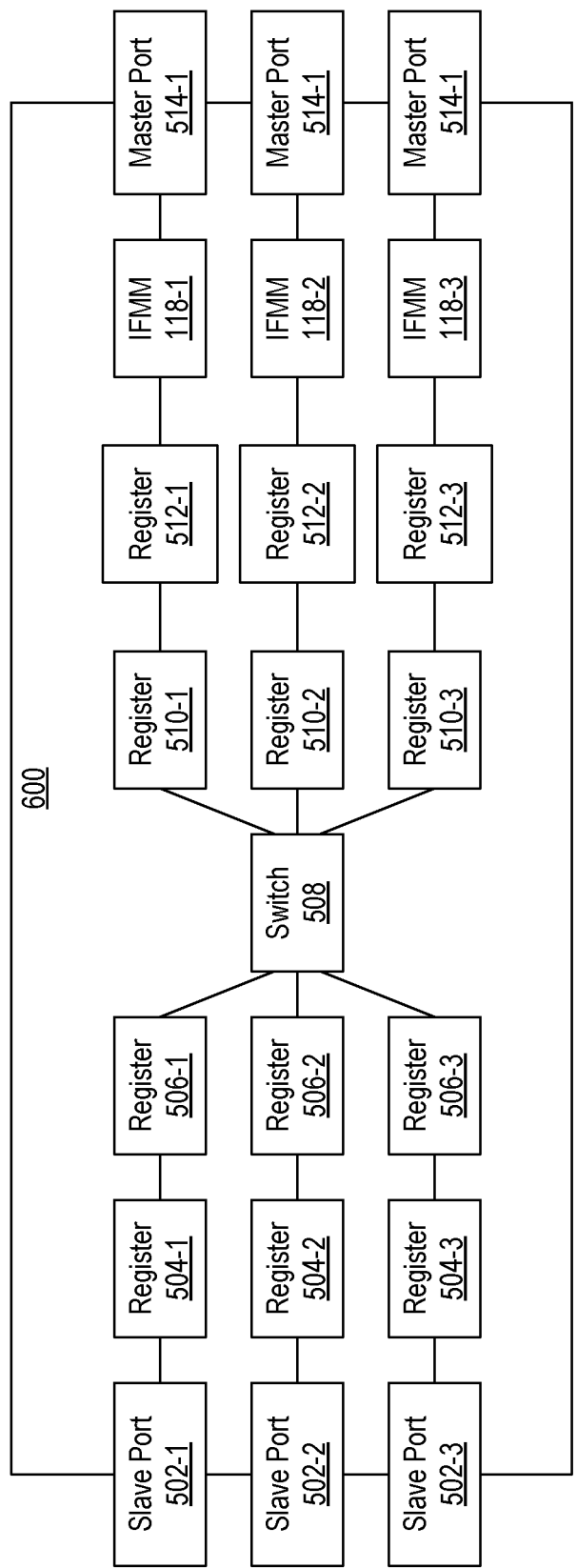
FIG. 6 illustrates an example of a modified stream switch model.

FIG. 6 illustrates an example of a stream switch model 600. Stream switch model 600 may be used as part of modified device model 116 to represent stream interconnects 316. Stream switch model 600 is an example of a modified stream switch model. Stream switch model 600 is similar to stream switch model 500 of FIG. 5 with the exception that one or more infinite FIFO memory models 118 (abbreviated IFMM in FIG. 6) are included. As shown, infinite FIFO memory models 118-1, 118-2, and 118-3 are incorporated into the different data paths as shown. Each of infinite FIFO memory models 118 is capable of providing a scalable or extendable amount of FIFO memory during runtime of a simulation.

Each infinite FIFO memory model 118 is capable of storing samples when the incoming sample cannot be forwarded to the corresponding master port 514. This may occur due to backpressure caused by the circuitry and/or logic ahead of the respective master port 514. As soon as a sample can be written on the respective master port 514, and if there were sample(s) stored in infinite FIFO memory model 118, such sample(s) are read from the respective infinite FIFO memory model 118 one-by-one and pushed on to the corresponding master port 514. As part of stream switch model 600, each infinite FIFO memory model 118 is capable of tracking the amount of data stored therein, scaling in size to accommodate such data, and storing an indication (e.g., a value) specifying the largest amount of data (e.g., number of samples) stored therein at any time during simulation.

It should be appreciated that, with the exception of infinite FIFO memory model(s) 118, the implementation of stream switch model 600 corresponds to, and may be modified to correlate to, the actual circuit architecture of the particular stream interconnect 316 being modeled.

Figure 7:
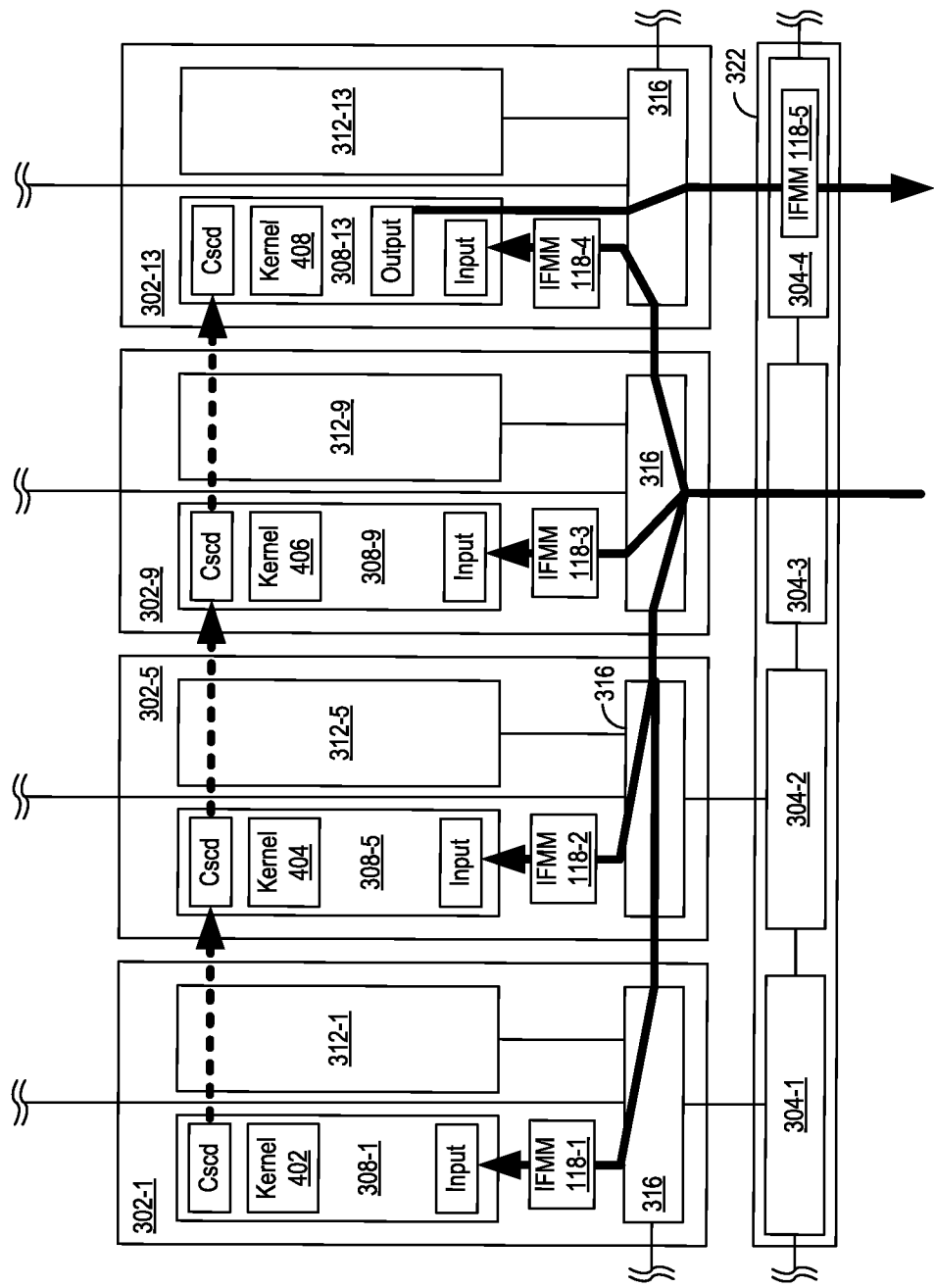
FIG. 7 illustrates an example of a design implemented on a portion of a data processing array, where the data processing array is represented by a modified device model with an alternative implementation of infinite First-In-First-Out (FIFO) memory models.

FIG. 7 illustrates an example of a design implemented on a portion of a data processing array, where the data processing array is represented by modified device model 116 with an alternative implementation of infinite FIFO memory models 118. In the example, infinite FIFO memory models 118 are included in various data paths of device model 116. As shown, infinite FIFO memory models 118 need not be incorporated into stream switch models. For example, infinite FIFO memory models 118-1, 118-2, 118-3, and 118-4 may be included in data paths and not included in stream switch models. Infinite FIFO memory model 118-5 may be included in interface tile 304. Infinite FIFO memory model 118-5 may be included in interface tile 304-5 either within the stream switch model thereof or outside of the stream switch model thereof. In one more examples, infinite FIFO memory models 118 may be incorporated into device model 116 at the end points of nets.

Figure 8:
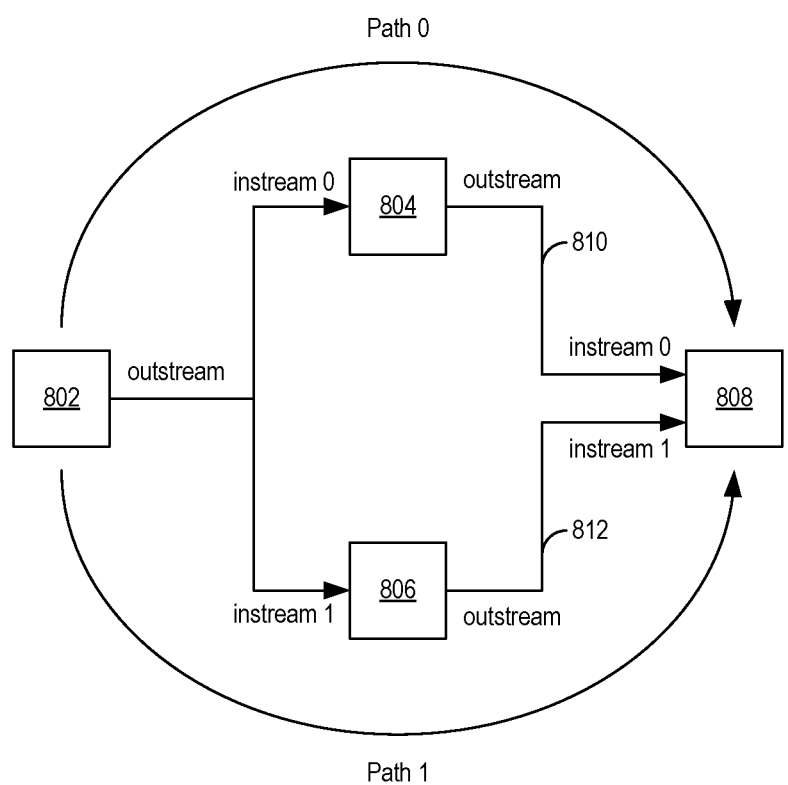
FIG. 8 illustrates an example of a deadlock condition that can be detected and alleviated using the inventive arrangements described within this disclosure.

FIG. 8 illustrates an example of a deadlock condition that can be detected and alleviated using the inventive arrangements described within this disclosure. The example of FIG. 8 illustrates kernels 802, 804, 806, and 808 each executing in a core 308 of a different compute tile 302. The kernels are coupled by data streams conveyed over stream interconnects 316. In the example, kernel 802 generates data that is provided to both kernels 804 and 806. Kernels 804 and 806 each consume data from kernel 802 and generate data that is consumed by kernel 808.

For purposes of illustration, during simulation using device model 114, in a single iteration kernel 804 reads 100 samples from kernel 802, processes all 100 samples, generates 100 samples as output, and pushes that data to kernel 808 via net 810. Meanwhile, in a single iteration, kernel 806 reads a sample from kernel 802, processes the sample, and pushes that data to kernel 808 via net 812. Kernel 806 performs this 100 times. In the example, the total FIFO capacity of net 810 and net 812 is 20 samples.

During the simulation, kernel 808 may be waiting to read data first from net 810, leading kernel 808 into a stall state. That is, since kernel 804 still may be reading the 100 samples and yet to write on net 810, there is no data for kernel 808 to consume on net 810. Meanwhile kernel 806 is generating samples and pushing the samples into net 812. The samples on net 812, however, are not being read by kernel 808 leading to back pressure on net 812. Eventually kernel 806 will fill the FIFO memory available on net 812 leading kernel 806 to stall and cause back pressure towards kernel 802. Once the back pressure reaches kernel 802, kernel 802 will stop pushing more data out. This causes kernel 804 to never receive the required 100 samples for processing leading kernel 804 into a stall state.

At this point kernel 802, kernel 804, kernel 806, kernel 808 all are in a stall state. Kernel 802 is in a stall state because the kernel cannot write more data on the net connected to kernel 806. Kernel 804 is in a stall state because the kernel cannot get the required number of input samples (in this example 100 samples) from kernel 802. Kernel 806 is in a stall state because the kernel cannot write any more data on net 812 because the FIFO memory capacity of the net is already utilized (e.g., full). Kernel 808 is in a stall state because the kernel cannot find any data to read on net 810. Kernel 808 will read from net 812 only when it may also read from net 810. In this example, the simulation fails (e.g., hangs or errors out).

By applying the inventive arrangements described herein, the design of FIG. 8 may be simulated a second time using modified device model 116. The infinite FIFO memory models 118 included in modified device model 116 are allowed to expand to accommodate all of the data that is generated by kernel 806 during simulation (e.g., on net 812) and also allowing data generated by kernel 804 (e.g., on net 810) to be accommodated during simulation. At the conclusion of simulation, FIFO memory usage data 122 indicates that net 812 requires sufficient FIFO memory to store 100 samples and net 810 requires sufficient FIFO memory to store 50 samples. EDA system 100 may determine that the amount of data needed per FIFO memory usage data 122 and/or FIFO report 124 is larger than what was previously allocated. FIFO report 124 and/or design constraints 126 may be generated by FIFO analyzer 106 so that when the design is recompiled, additional FIFO memory is added to net 812 so that the FIFO memory allocated to net 812 has a depth of 50 samples. An example of the heuristics used and applied to generate FIFO report 124 and/or design constraints 126 is described in connection with FIG. 9. The design constraints may be determined by FIFO analyzer 106 based on FIFO memory usage data 122, compiled design 112, and one or more heuristics as previously discussed.

A subsequent, e.g., third, simulation using device model 114 and with the design recompiled to include the added FIFO memory (e.g., a FIFO memory having a depth of 50 samples on net 812 results in a passing simulation. This indicates that the initial problem was a deadlock and that the deadlock is removed by adding the additional FIFO memory on net 812.

Without the inventive arrangements described herein, determining the cause of error and/or a deadlock in the scenario described in connection with FIG. 8 is exceedingly difficult. Conventional techniques have involved first analyzing the kernel(s) and performing multiple different simulations with varying FIFO depths applied to the different nets. This requires multiple compilations of the design and multiple simulations. Despite such efforts, a successful outcome was not always achieved. Moreover, the time required for such analysis increases with the number of kernels and complexity in connectivity of the design. Typical designs include more than 4 kernels, for example. In many cases, increased FIFO depths identified through conventional analysis techniques result in using larger FIFO depths than are needed to resolve the issues. This means that the design utilizes more hardware resources than is needed when such resources may be scarce.

Figure 9:
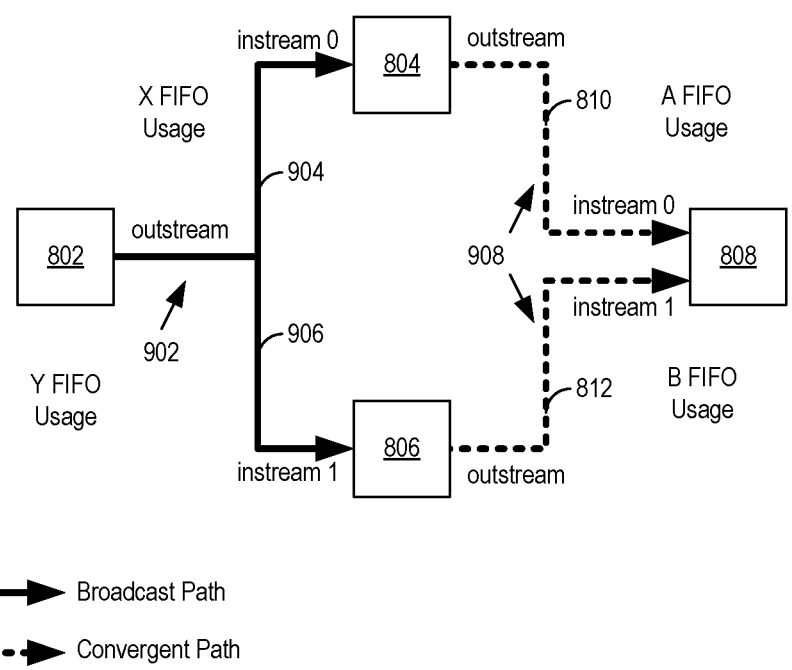
FIG. 9 illustrates examples of heuristics and application of heuristics by the FIFO analyzer.

FIG. 9 illustrates examples of heuristics and application of heuristics by FIFO analyzer 106. FIG. 9 illustrates two different cases where heuristics are applied by FIFO analyzer 106. Subsequent to simulator 104 having been run using modified device model 116, FIFO analyzer 106 is capable of using FIFO memory usage data 122 and compiled design 112 to identify sets of broadcast data paths and/or sets of convergent data paths that utilize or include an infinite FIFO memory model 118.

The example of FIG. 9 illustrates a portion of a design including kernels 802, 804, 806, and 808 each being implemented in a different compute tile and being connected as illustrated. A key is provided illustrating which data paths are broadcast data paths and which data paths are convergent data paths. As illustrated, a set of broadcast data paths 902 originate at kernel 802 and extend to kernel 804 and to kernel 806. The broadcast data paths included in a same set are those that have a same origination point or source and end at different ending points or loads. In this example, the set of broadcast data paths 902 includes broadcast data path (e.g., net) 904 and broadcast data path (e.g., net) 906. A set of convergent data paths 908 originate at kernels 804 and 806 and extend to kernel 808. The convergent data paths included in a same set are those that begin at different starting points or sources and terminate at a same ending point or load. In this example, the set convergent data paths 906 includes net 810 and net 812. As discussed, since a net collectively refers to one or more data streams (e.g., logical nets) as mapped to a particular physical data path through the data processing array as specified by the routing data, the use of the term "net" in this example refers to the data path taken by each respective net. A design (or compiled design) may include only one or more broadcast data paths, only one or more convergent data paths, or one or more broadcast data paths and one or more convergent data paths.

An example of a heuristic used and applied by FIFO analyzer 106 is a broadcast data path heuristic. In general, a broadcast data path heuristic determines the broadcast path having the smallest FIFO usage and subtracts that FIFO usage from each other broadcast data path of a set of broadcast data paths. For purposes of illustration, consider an example where, based on FIFO memory usage data 122, FIFO analyzer 106 determines that, of the infinite FIFO memory models 118 in broadcast data path 904, "X" amount of data storage is used. FIFO analyzer 106 determines that, of the infinite FIFO memory models 118 in broadcast data path 906, "Y" amount of data storage is used. For purposes of illustration, X>Y. In this example, FIFO analyzer 106 generates a recommendation (e.g., as FIFO report 124 and/or design constraints 126) that X-Y amount of FIFO memory (e.g., a non-zero amount) be added to broadcast data path 904 and that Y-Y or zero FIFO memory be added to broadcast data path 906. Appreciably, broadcast data path 906 may be omitted from any recommendation(s). In the example, the amount of FIFO memory usage of the smallest broadcast data path of a set of broadcast data paths is subtracted from each broadcast data path of the set of broadcast data paths. The remaining amount, if non-zero, is provided by FIFO analyzer 106 as the recommended amount of FIFO memory to be added for each respective broadcast data path. This process may be performed for each set of broadcast data paths of the compiled design.

Another example of a heuristic used and applied by FIFO analyzer 106 is a convergent data path heuristic. In general, a convergent data path heuristic determines the convergent data path having the smallest FIFO usage and subtracts that FIFO usage from each other convergent data path of a set of convergent data paths. Continuing with the example for purposes of illustration, based on FIFO memory usage data 122, FIFO analyzer 106 determines that, of the infinite FIFO memory models 118 of net 810, "A" amount of data storage is used. FIFO analyzer 106 determines that, of the infinite FIFO memory models 118 of net 812, "B" amount of data storage is used. For purposes of illustration, B>A. In this example, FIFO analyzer 106 generates a recommendation (e.g., as FIFO report 124 and/or design constraints 126) that A-A or zero amount of FIFO memory be added to net 810 and that B-A (e.g., a non-zero amount) FIFO memory be added to net 812. Appreciably, net 810 may be omitted from any recommendation(s). In the example, the amount of FIFO memory usage of the smallest convergent data path of a set of convergent data paths is subtracted from each convergent data path of the set. The remaining amount, if non-zero, is provided as the recommended amount of FIFO memory to be added for each respective convergent data path. This process may be performed for each set of convergent data paths of the compiled design.

In the examples of FIG. 9, only two data paths are illustrated in each of the sets. It should be appreciated that application of the heuristics by FIFO analyzer 106 may be performed in cases where the set(s) of broadcast and/or convergent data paths include three or more such data paths (or nets) as the case may be.

Figure 10:
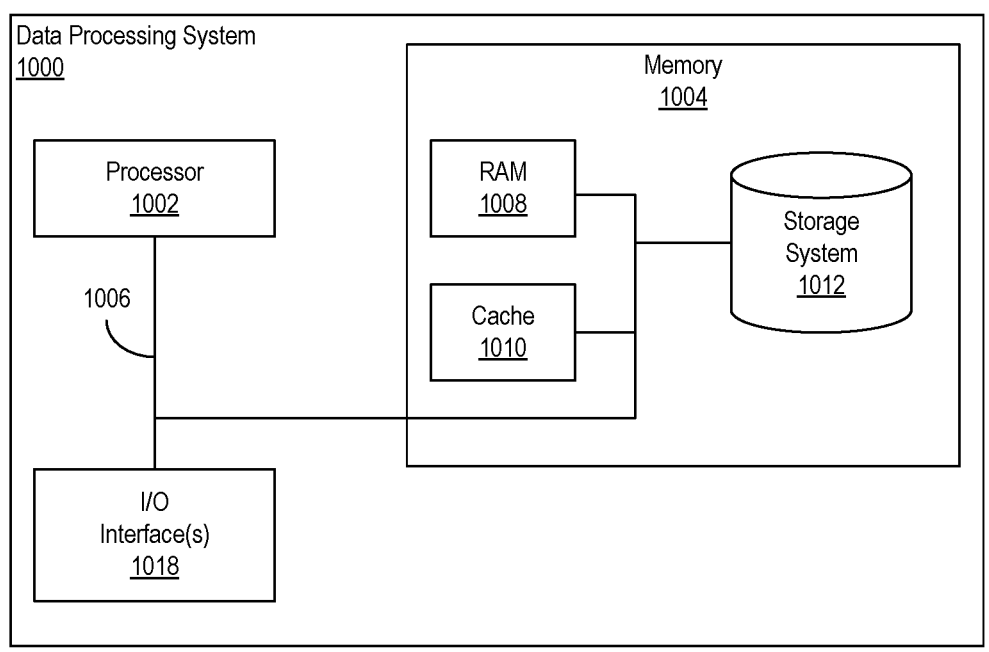
FIG. 10 illustrates an example implementation of a data processing system for use with the inventive arrangements.

FIG. 10 illustrates an example implementation of a data processing system 1000. As defined herein, the term "data processing system" means one or more hardware systems configured to process data, each hardware system including at least one processor and memory, wherein the processor is programmed with computer-readable instructions that, upon execution, initiate operations. Data processing system 1000 can include a processor 1002, a memory 1004, and a bus 1006 that couples various system components including memory 1004 to processor 1002.

Processor 1002 may be implemented as one or more processors. In an example, processor 1002 is implemented as a central processing unit (CPU). Processor 1002 may be implemented as one or more circuits capable of carrying out instructions contained in program code. The circuit may be an integrated circuit or embedded in an integrated circuit. Processor 1002 may be implemented using a complex instruction set computer architecture (CISC), a reduced instruction set computer architecture (RISC), a vector processing architecture, or other known architectures. Example processors include, but are not limited to, processors having an x86 type of architecture (IA-32, IA-64, etc.), Power Architecture, ARM processors, and the like.

Bus 1006 represents one or more of any of a variety of communication bus structures. By way of example, and not limitation, bus 1006 may be implemented as a Peripheral Component Interconnect Express (PCIe) bus. Data processing system 1000 typically includes a variety of computer system readable media. Such media may include computer-readable volatile and non-volatile media and computer-readable removable and non-removable media.

Memory 1004 can include computer-readable media in the form of volatile memory, such as random-access memory (RAM) 1008 and/or cache memory 1010. Data processing system 1000 also can include other removable/non-removable, volatile/non-volatile computer storage media. By way of example, storage system 1012 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1006 by one or more data media interfaces. Memory 1004 is an example of at least one computer program product.

Memory 1004 is capable of storing computer-readable program instructions that are executable by processor 1002. For example, the computer-readable program instructions can include an operating system, one or more application programs, other program code, and program data. Processor 1002, in executing the computer-readable program instructions, is capable of performing the various operations described herein with reference to FIGS. 1 and 2, for example. It should be appreciated that data items used, generated, and/or operated upon by data processing system 1000 are functional data structures that impart functionality when employed by data processing system 1000. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 1000 may include one or more Input/Output (I/O) interfaces 1018 communicatively linked to bus 1006. I/O interface(s) 1018 allow data processing system 1000 to communicate with one or more external devices and/or communicate over one or more networks such as a local area network (LAN), a wide area network (WAN), and/or a public network (e.g., the Internet). Examples of I/O interfaces 1018 may include, but are not limited to, network cards, modems, network adapters, hardware controllers, etc. Examples of external devices also may include devices that allow a user to interact with data processing system 1000 (e.g., a display, a keyboard, and/or a pointing device) and/or other devices such as accelerator card.

Data processing system 1000 is only one example implementation. Data processing system 1000 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

The example of FIG. 10 is not intended to suggest any limitation as to the scope of use or functionality of example implementations described herein. Data processing system 1000 is an example of computer hardware and an EDA system that is capable of performing the various operations described within this disclosure. In this regard, data processing system 1000 may include fewer components than shown or additional components not illustrated in FIG. 10 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer-readable storage medium" means a storage medium that contains or stores program instructions for use by or in connection with an instruction execution system, apparatus, or device. As defined herein, a "computer-readable storage medium" is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term "program code" is used interchangeably with the term "program instructions." Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
compiling a design for a data processing array to generate a compiled design, wherein the compiled design is mapped and routed to the data processing array;
simulating the compiled design using a modified device model of the data processing array, wherein the modified device model uses infinite first-in-first-out memory (FIFO) models;
generating FIFO memory usage data by tracking amounts of data stored in the infinite FIFO memory models during runtime of the simulation of the compiled design; and
determining FIFO memory requirements for one or more nets of the design based on the FIFO memory usage data and the compiled design.

2. The method of claim 1, wherein the tracking amounts of data determines a largest amount of data stored within the infinite FIFO memory models during runtime of the simulation.

3. The method of claim 1, wherein the FIFO memory requirements indicate that an additional FIFO memory is needed for the one or more nets of the design.

4. The method of claim 3, wherein the FIFO memory requirements specify an amount of the additional FIFO memory needed for the one or more nets of the design.

5. The method of claim 1, further comprising:
generating, based on the FIFO memory usage data and the compiled design, a design constraint for the design, wherein the design constraint specifies insertion of a FIFO memory on the one or more nets of the design.

6. The method of claim 5, further comprising:
compiling the design using the design constraint resulting in a further compiled design including the FIFO memory specified by the design constraint.

7. The method of claim 6, further comprising:
performing a further simulation of the further compiled design using an unmodified device model that has unmodified stream switch models with finite FIFO memory models.

8. The method of claim 7, wherein a prior simulation of the compiled design using the unmodified device model failed, the method further comprising:
in response to determining that the further simulation passed, determining that a cause of failure of the prior simulation of the compiled design using the unmodified device model was a deadlock.

9. The method of claim 7, wherein a prior simulation of the compiled design using the unmodified device model passed, the method further comprising:
in response to determining that the further simulation passes, comparing a performance metric from the further simulation with a performance metric from the prior simulation of the compiled design using the unmodified device model; and
determining whether the FIFO memory included in the further compiled design improved performance relative to the compiled design based on the comparing.

10. A system, comprising:
one or more processors configured to initiate operations including:
compiling a design for a data processing array to generate a compiled design, wherein the compiled design is mapped and routed to the data processing array;
simulating the compiled design using a modified device model of the data processing array, wherein the modified device model uses infinite first-in-first-out memory (FIFO) models;
generating FIFO memory usage data by tracking amounts of data stored in the infinite FIFO memory models during runtime of the simulation of the compiled design; and
determining FIFO memory requirements for one or more nets of the design based on the FIFO memory usage data and the compiled design.

11. The system of claim 10, wherein the tracking amounts of data determines a largest amount of data stored within the infinite FIFO memory models during runtime of the simulation.

12. The system of claim 10, wherein the FIFO memory requirements indicate that an additional FIFO memory is needed for the one or more nets of the design.

13. The system of claim 12, wherein the FIFO memory requirements specify an amount of the additional FIFO memory needed for the one or more nets of the design.

14. The system of claim 10, wherein the one or more processors are configured to initiate operations further comprising:
generating, based on the FIFO memory usage data and the compiled design, a design constraint for the design, wherein the design constraint specifies insertion of a FIFO memory on the one or more nets of the design.

15. The system of claim 14, wherein the one or more processors are configured to initiate operations further comprising:
compiling the design using the design constraint resulting in a further compiled design including the FIFO memory specified by the design constraint.

16. The system of claim 15, wherein the one or more processors are configured to initiate operations further comprising:
performing a further simulation of the further compiled design using an unmodified device model that has unmodified stream switch models with finite FIFO memory models.

17. The system of claim 16, wherein a prior simulation of the compiled design using the unmodified device model failed, wherein the one or more processors are configured to initiate operations further comprising:
in response to determining that the further simulation passed, determining that a cause of failure of the prior simulation of the compiled design using the unmodified device model was a deadlock.

18. The system of claim 16, wherein a prior simulation of the compiled design using the unmodified device model passed, wherein the one or more processors are configured to initiate operations further comprising:
in response to determining that the further simulation passes, comparing a performance metric from the further simulation with a performance metric from the prior simulation of the compiled design using the unmodified device model; and
determining whether the FIFO memory included in the further compiled design improved performance relative to the compiled design based on the comparing.

19. A computer program product, comprising:
one or more computer-readable storage media, and program instructions collectively stored on the one or more computer-readable storage media, wherein the program instructions are executable by computer hardware to initiate operations including:
compiling a design for a data processing array to generate a compiled design, wherein the compiled design is mapped and routed to the data processing array;
simulating the compiled design using a modified device model of the data processing array, wherein the modified device model uses infinite first-in-first-out memory (FIFO) models;
generating FIFO memory usage data by tracking amounts of data stored in the infinite FIFO memory models during runtime of the simulation of the compiled design; and
determining FIFO memory requirements for one or more nets of the design based on the FIFO memory usage data and the compiled design.

20. The computer program product of claim 19, wherein the FIFO memory requirements indicate that an additional FIFO memory is needed for the one or more nets of the design and an amount of the additional FIFO memory needed for the one or more nets of the design.

* * * * *